(12) United States Patent
Wu et al.

(10) Patent No.: US 8,546,061 B2
(45) Date of Patent: Oct. 1, 2013

(54) PHOTO-CURING POLYSILOXANE COMPOSITION AND PROTECTIVE FILM FORMED FROM THE SAME

(75) Inventors: Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 28 days.

(21) Appl. No.: 13/291,305

(22) Filed: Nov. 8, 2011

(65) Prior Publication Data

US 2012/0141936 A1 Jun. 7, 2012

(30) Foreign Application Priority Data

Dec. 1, 2010 (TW) ................ 99141704 A

(51) Int. Cl.
*G03F 7/022* (2006.01)
*G03F 7/038* (2006.01)
*G03F 7/075* (2006.01)
*G03F 7/11* (2006.01)

(52) U.S. Cl.
USPC ........ 430/270.1; 430/905; 430/919; 430/921; 430/923; 430/272.1; 522/57; 522/59; 522/99; 522/148

(58) Field of Classification Search
None
See application file for complete search history.

(56) References Cited

U.S. PATENT DOCUMENTS

2004/0143082 A1   7/2004  Iwasawa et al.

FOREIGN PATENT DOCUMENTS

| CN | 101082771 A | 12/2007 |
|---|---|---|
| CN | 101324755 A | 12/2008 |
| CN | 101784958 A | 7/2010 |
| JP | 2008-107529 A | 5/2008 |
| JP | 2009223293 A | 10/2009 |

OTHER PUBLICATIONS

U.S. Appl. No. 13/291,305, filed Nov. 8, 2011, Photo-Curing Polysiloxane Composition and Protective Film Formed From the Same.
U.S. Appl. No. 13/671,016, filed Nov. 7, 2012, Photo-Curing Polysiloxane Composition and Application Thereof.
U.S. Appl. No. 13/792,513, filed Mar. 11, 2013, Photo-Curing Polysiloxane Composition and Applications Thereof.
U.S. Appl. No. 13/860,771, filed Apr. 11, 2013, Photo-Curing Polysiloxane Composition and Application Thereof.
U.S. Appl. No. 13/875,903, filed May 2, 2013, Photo-Curing Polysiloxane Composition and Applications Thereof.
State Intellectual Property Office of the P.R.C. Search Report dated Oct. 25, 2012, Chinese Application Serial No. 2011103617419 filed on Nov. 15, 2011, in the name of Chi Mei Corporation.

*Primary Examiner* — Sin J. Lee
(74) *Attorney, Agent, or Firm* — Fox Rothschild, LLP; Robert J. Sacco

(57) ABSTRACT

A photo-curing polysiloxane composition includes a polysiloxane, an o-naphthoquinonediazidesulfonate compound, and a solvent. The polysiloxane contains 25 wt % to 60 wt % of a polysiloxane fraction having a molecular weight ranging from 10,000 to 80,000 based on a total weight of the polysiloxane when calculated from an integral molecular weight distribution curve obtained by plotting cumulative weight percentage versus molecular weight falling within a range between 400 and 100,000 measured by gel permeation chromatography. The amount of oligomers in the polysiloxane having a molecular weight less than 800 is from 0 wt % to 10 wt % based on a total weight of the photo-curing polysiloxane composition. A protective film formed from the photo-curing polysiloxane composition and an element containing the protective film are also disclosed.

7 Claims, 1 Drawing Sheet

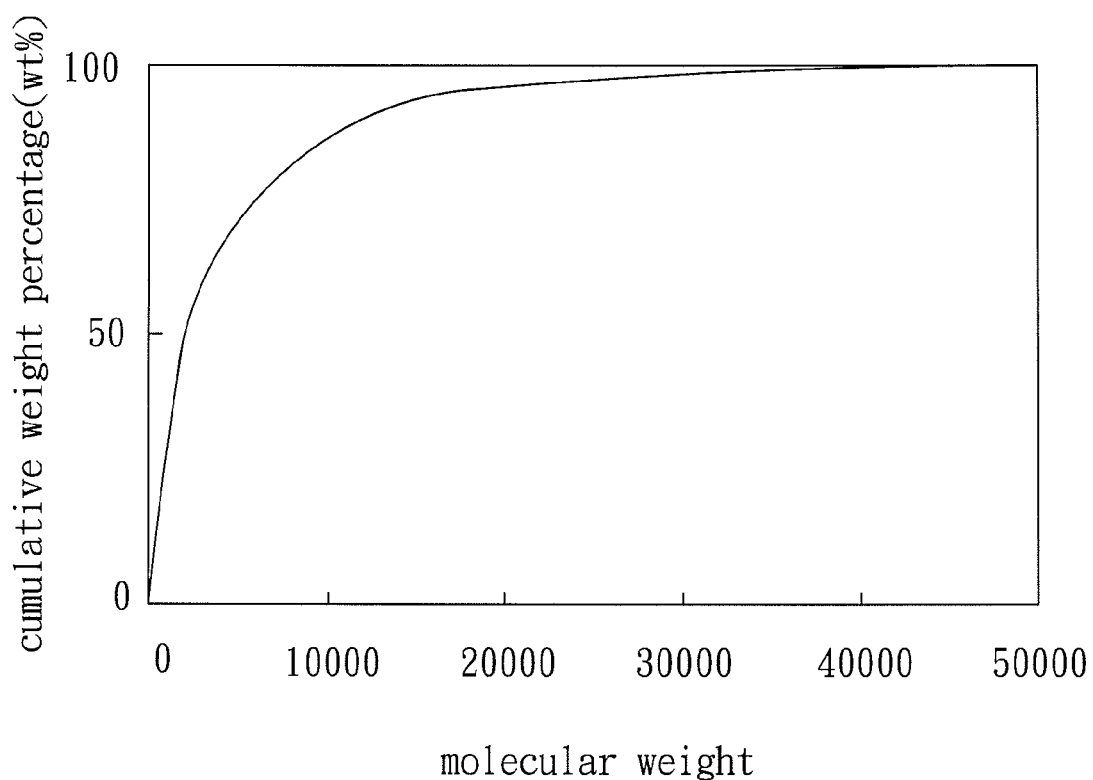

PHOTO-CURING POLYSILOXANE COMPOSITION AND PROTECTIVE FILM FORMED FROM THE SAME

CROSS-REFERENCE TO RELATED APPLICATION

This application claims priority of Taiwanese Application No. 099141704, filed Dec. 1, 2010.

BACKGROUND OF THE INVENTION

1. Field of the Invention

This invention relates to a photo-curing polysiloxane composition, more particularly to a photo-curing polysiloxane composition for forming a planarizing film for a substrate of a liquid crystal display (LCD), an organic electroluminescene display, and the like, an interlayer insulating film, and a core or a cladding of an optical waveguide as a protective film. This invention also relates to a protective film formed from the photo-curing polysiloxane composition and an element containing the protective film.

2. Description of the Related Art

Recently, in the field of a semiconductor, a liquid crystal display, an organic electroluminescene display, or the like, it is increasingly required to provide a pattern with good fineness in the lithographic process. A positive photosensitive material having high resolution and high sensitivity is commonly used. However, a conventional positive photosensitive material containing polysiloxane cannot be effectively developed to form a pattern with good fineness using a dilute alkali solution as a developer because of the hydrophobicity of the polysiloxane.

JP 2008-107529 discloses a photosensitive resin composition which can form a cured film with high transparency. The disclosed photosensitive resin composition comprises (a) a polysiloxane containing oxetanyl group or succinic anhydride group; (b) a quinonediazide compound; and (c) a solvent. Although the polysiloxane containing oxetanyl group or succinic anhydride group can form a hydrophilic structure after a ring-opening reaction during the copolymerization and be developed in a dilute alkali developer, the cured film obtained from the photosensitive resin composition easily results in a pattern reflow problem after post-baking.

It is still required in the art to provide a photosensitive resin composition which can be used in a dilute alkali solution as a developer to form a protective film having a developed pattern with no reflow after post-baking.

SUMMARY OF THE INVENTION

Therefore, an object of the present invention is to provide a photo-curing polysiloxane composition which has a proper softening point and good developing property such that the developed pattern in a protective film obtained from the composition is not liable to reflow after post-baking.

According to a first aspect of this invention, there is provided a photo-curing polysiloxane composition including a polysiloxane, an o-naphthoquinonediazidesulfonate compound, and a solvent. The polysiloxane contains 25 wt % to 60 wt % of a polysiloxane fraction having a molecular weight ranging from 10,000 to 80,000 based on a total weight of the polysiloxane when calculated from an integral molecular weight distribution curve obtained by plotting cumulative weight percentage versus molecular weight falling within a range between 400 and 100,000 measured by gel permeation chromatography. The amount of oligomers in the polysiloxane having a molecular weight less than 800 is from 0 wt % to 10 wt % based on a total weight of the photo-curing polysiloxane composition.

According to a second aspect of this invention, there is provided a protective film which is adapted to be formed on a substrate. The protective film is formed by applying the photo-curing polysiloxane composition of this invention on the substrate following by pre-baking, exposing, developing, and post-baking.

According to a third aspect of this invention, there is provided an element including a substrate, and the protective film of this invention applied on the substrate.

BRIEF DESCRIPTION OF THE DRAWING

Other features and advantages of the present invention will become apparent in the following detailed description of the preferred embodiments with reference to the accompanying drawing, of which:

FIG. 1 is an example of an integral molecular weight distribution curve obtained by plotting cumulative weight percentage versus molecular weight.

DETAILED DESCRIPTION OF THE PREFERRED EMBODIMENTS

The photo-curing polysiloxane composition of the present invention includes a polysiloxane, an o-naphthoquinonediazidesulfonate compound, and a solvent. The polysiloxane contains 25 wt % to 60 wt % of a polysiloxane fraction having a molecular weight ranging from 10,000 to 80,000 based on a total weight of the polysiloxane when calculated from an integral molecular weight distribution curve obtained by plotting cumulative weight percentage versus molecular weight falling within a range between 400 and 100,000 measured by gel permeation chromatography. The amount of oligomers in the polysiloxane having a molecular weight less than 800 is from 0 wt % to 10 wt % based on a total weight of the photo-curing polysiloxane composition.

Polysiloxane:

There is no specific limitation to the structure of polysiloxane. Preferably, the polysiloxane is obtained by subjecting a silane monomer, a siloxane prepolymer, or a combination of a silane monomer and a siloxane prepolyer to hydrolysis and partial condensation.

The silane monomer is preferably represented by Formula (I):

$$SiR^1_m(OR^2)_{4-m} \qquad (I).$$

m denotes an integer ranging from 0 to 3.

$R^1$ represents a hydrogen atom, a substituted or unsubstituted $C_1$-$C_{10}$ alkyl group, a substituted or unsubstituted $C_2$-$C_{10}$ alkenyl group, or a substituted or unsubstituted $C_6$-$C_{15}$ aryl group. The plural $R^1$s can be identical with or different from each other when m is 2 or 3. Examples of the alkyl group include, but are not limited to, methyl, ethyl, n-propyl, isopropyl, n-butyl, tert-butyl, n-pentyl, n-decyl, trifluoromethyl, 3,3,3-trifluoropropyl, 3-glycidoxypropyl, 2-(3, 4-epoxycyclohexyl)ethyl, 3-aminopropyl, 3-mercaptopropyl, 3-isocyanatopropyl, 2-oxetanylpropylbutoxypropyl, 3-glutaric anhydride propyl, 3-succinic anhydride propyl, 2-succinic anhydride ethyl, or the like. Examples of the alkenyl group include, but are not limited to, vinyl, 3-acryloxypropyl, 3-methacryloxypropyl, or the like. Examples of the aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, naphthyl, naphthyl, or the like.

$R^2$ represents a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. The plural $R^2$s can be identical with or different from each other when 4−m is 2, 3, or 4. Examples of the alkyl group include, but are not limited to, methyl, ethyl, n-propyl, isopropyl, n-butyl, or the like. Examples of the acyl group include, but are not limited to, acetyl, or the like. Examples of the aryl group include, but are not limited to, phenyl, or the like.

When m denotes 0, the silane monomer represents a tetrafunctional silane. When m denotes 1, the silane monomer represents a trifunctional silane. When m denotes 2, the silane monomer represents a difunctional silane. When m denotes 3, the silane monomer represents a monofunctional silane.

Examples of the silane monomer include, but are not limited to, (1) tetrafunctional silane: tetramethoxysilane, tetraethoxysilane, tetraacetoxysilane, tetraphenoxysilane, or the like; (2) trifunctional silane: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloyloxypropyltrimethoxysilane, 3-acryloyloxypropyltriethoxysilane, 3-methylacryloyloxypropyltrimethoxysilane, 3-methylacryloyloxypropyltriethoxysilane, phenyltrimethoxysilane (PTMS), phenyltriethoxysilane (PIES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3 aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 2-oxetanylbutoxypropyltriphenoxysilane, commercially available 2-oxetanylbutoxypropyltrimethoxysilane manufactured by Toagosei (trade name: TMSOX), commercially available 2-oxetanylbutoxypropyltriethoxysilane manufactured by Toagosei (trade name: TESOX), 2-trimethoxysilylethyl succinic anhydride, 3-triphenoxysilylpropyl succinic anhydride, commercially available 3-trimethoxysilylpropyl succinic anhydride manufactured by Shin-Etsu (trade name: X-12-967), commercially available 3-triethoxysilylpropyl succinic anhydride manufactured by WACKER (trade name: GF-20), 3-trimethoxysilylpropyl glutaric anhydride (TMSG), 3-triethoxysilylpropyl glutaric anhydride, 3-triphenoxysilylpropyl glutaric anhydride, or the like; (3) difunctional silane: dimethyldimethoxysilane (DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxysilane, di-n-butoxysilyl dipropylsuccinic anhydride, dimethoxysilyl diethylsuccinic anhydride, or the like; and (4) monofunctional silane: trimethylmethoxysilane, tri-n-butylethoxysilane, 3-glycidoxydimethylmethoxysilane, 3-glycidoxydimethylethoxysilane, di(2-oxetanylbutoxypentyl)-2-oxetanylpentylethoxysilane, tri(2-oxetanylpentyl)methoxysilane, phenoxysilyltripropylsuccinic anhydride, methylmethoxysilyldiethylsuccinic anhydride, or the like. The aforesaid examples of the silane monomer can be used alone or as a mixture of two or more.

The siloxane prepolymer is preferably represented by Formula (II):

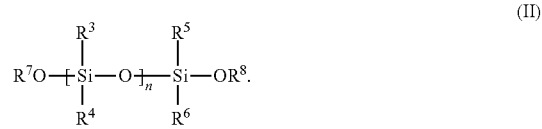

(II)

n denotes an integer ranging from 1 to 1,000, preferably from 3 to 300, and more preferably from 5 to 200.

$R^3$, $R^4$, $R^5$, and $R^6$ represent, respectively and independently, a hydrogen atom, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. The plural $R^3$s and $R^4$s can be respectively identical with or different from each other when n is from 2 to 1,000. Examples of the alkyl group include, but are not limited to, methyl, ethyl, n-propyl, or the like. Examples of the alkenyl group include, but are not limited to, vinyl, acryloxypropyl, methacryloxypropyl, or the like. Examples of the aryl group include, but are not limited to, phenyl, tolyl, naphthyl, or the like.

$R^7$ and $R^8$ represent, respectively and independently, a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, n-butyl, or the like. Examples of the acyl group include, but are not limited to, acetyl, or the like. Examples of the aryl group include, but are not limited to, phenyl, or the like.

Examples of the siloxane prepolymer include, but are not limited to, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, commercially available silanol terminal polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), or the like), or the like. The aforesaid examples of the siloxane prepolymer can be used alone or as a mixture of two or more.

When the silane monomer and the siloxane prepolymer are used in combination, there is no specific limitation to the mixing ratio thereof. Preferably, the molar ratio of the silane monomer and the siloxane prepolymer in Si atom ranges from 100:0 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include commercially available products manufactured by Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), or the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), or the like; commercially available products manufactured Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), or the like. The aforesaid silicon dioxide particles can be used alone or as a mixture of two or more.

There is no specific limitation to the amounts when mixing the silicon dioxide particles with the silane monomer and/or the siloxane prepolymer. Preferably, the molar ratio of the silicon dioxide particles to the polysiloxane in Si atom ranges from 1% to 50%.

The hydrolysis and the partial condensation can be conducted in a manner well known in the art. For example, a solvent, water, and optionally a catalyst are added to the mixture of the silane monomer and/or the siloxane prepolymer and/or the silicon dioxide particles, followed by stirring at a temperature ranging from 50 to 150° C. for 0.5 to 120 hours. During stirring, the by-products, such as alcohols and water, can be removed by distillation if necessary.

There is no specific limitation to the solvent, which can be identical with or different from the solvent contained in the photo-curing polysiloxane composition. Preferably, the solvent is used in an amount ranging generally from 15 g to 1200 g, preferably from 20 g to 1100 g, and more preferably from 30 g to 1000 g, based on 100 g of the silane monomer and/or the siloxane prepolymer.

The amount of water for the hydrolysis ranges from 0.5 to 2 moles based on 1 mole of the hydrolyzable groups contained in the mixture.

There is no specific limitation to the catalyst, and an acid catalyst or a base catalyst can be preferably used. Examples of the acid catalyst include hydrochloric acid, nitric acid, sulfuric acid, hydrofluoric acid, oxalic acid, phosphoric acid, acetic acid, trifluoroacetic acid, formic acid, polycarboxylic acids and anhydrides thereof, ion exchange resins, or the like. Examples of the base catalyst include diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilanes containing an amino group, ion exchange resins, or the like.

Preferably, the catalyst is used in an amount ranging generally from 0.005 g to 15 g, preferably from 0.01 g to 12 g, and more preferably from 0.05 g to 10 g, based on 100 g of the silane monomer and/or the siloxane prepolymer.

In view of the storage stability, it is preferable that the by-products (for example, alcohols or water) and the catalyst are not contained in polysiloxane produced after hydrolysis and partial condensation. Therefore, it is preferable to purify polysiloxane. There is no specific limitation to the purification method. Preferably, polysiloxane is diluted with a hydrophobic solvent, and the organic layer washed with water several times is then concentrated with an evaporator to remove alcohols and water. Additionally, the catalyst can be removed using ion exchange resin.

The obtained polysiloxane suitable for the photo-curing polysiloxane composition of the present invention contains 25 wt % to 60 wt % of a polysiloxane fraction having a molecular weight ranging from 10,000 to 80,000 based on a total weight of the polysiloxane when calculated from an integral molecular weight distribution curve obtained by plotting cumulative weight percentage versus molecular weight falling within a range between 400 and 100,000 measured by gel permeation chromatography.

Preferably, the polysiloxane fraction having a molecular weight ranging from 10,000 to 80,000 is from 28 wt % to 60 wt % based on a total weight of the polysiloxane. More preferably, the polysiloxane fraction having a molecular weight ranging from 10,000 to 80,000 is from 30 wt % to 60 wt % based on a total weight of the polysiloxane.

When the polysiloxane fraction having a molecular weight ranging from 10,000 to 80,000 is less than 25 wt % based on a total weight of the polysiloxane, the developed pattern in a protective film obtained from the photo-curing polysiloxane composition is liable to reflow after post-baking.

On the other hand, when the polysiloxane fraction having a molecular weight ranging from 10,000 to 80,000 is more than 60 wt % based on a total weight of the polysiloxane, the developing property may be deteriorated. Especially, when a developer with low concentration (for example, 0.4 wt % tetramethylammonium hydroxide) is used, a desirable pattern can not be formed in the development process.

Furthermore, the amount of oligomers in the polysiloxane having a molecular weight less than 800 is from 0 wt % to 10 wt %, preferably from 0.001 wt % to 9 wt %, and more preferably from 0.001 wt % to 8 wt %, based on a total weight of the photo-curing polysiloxane composition when the photo-curing polysiloxane composition is determined by gas chromatography.

When the amount of oligomers in the polysiloxane having a molecular weight less than 800 is more than 10 wt % based on a total weight of the photo-curing polysiloxane composition, the developed pattern in a protective film obtained from the photo-curing polysiloxane composition is liable to reflow after post-baking. This is because the polysiloxane with low molecular weight has a relatively low softening point, making reflow likely to occur after treatment at a high temperature.

Preferably, the polysiloxane has an alkali dissolution rate ranging from 100 to 1500 Å/sec. More preferably, the polysiloxane has an alkali dissolution rate ranging from 150 to 1400 Å/sec. Most preferably, the polysiloxane has an alkali dissolution rate ranging from 200 to 1300 Å/sec. When the polysiloxane has an alkali dissolution rate ranging from 100 to 1500 Å/sec, shape of the developed pattern can be well maintained without deformation, and the developing property can be enhanced.

O-naphthoquinonediazidesulfonate Compound:

There is no specific limitation to the o-naphthoquinonediazidesulfonate compound suitable in the photo-curing polysiloxane composition of the present invention. The o-naphthoquinonediazidesulfonate compound can be a fully or partially esterified compound. Preferably, the o-naphthoquinonediazidesulfonate compound is obtained via a reaction of o-naphthoquinonediazidesulfonic acid or salt thereof with a hydroxyl compound. More preferably, the o-naphthoquinonediazidesulfonate compound is obtained via a reaction of o-naphthoquinonediazidesulfonic acid or salt thereof with a polyhydroxyl compound.

Examples of o-naphthoquinonediazidesulfonic acid include, but are not limited to, o-naphthoquinonediazide-4-sulfonic acid, o-naphthoquinonediazide-5-sulfonic acid, o-naphthoquinonediazide-6-sulfonic acid, or the like.

Examples of the salt of o-naphthoquinonediazidesulfonic acid include, but are not limited to, halide of o-naphthoquinonediazidesulfonic acid.

Examples of the hydroxyl compound include, but are not limited to:
(1) hydroxybenzophenone compounds, for example, but not limited to, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, 2,3,4,3',4',5'-hexahydroxybenzophenone, or the like.
(2) hydroxyaryl compounds, for example, but not limited to, a hydroxyaryl compound represented by Formula (III):

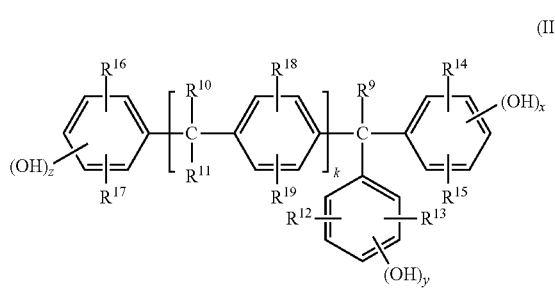

wherein
$R^9$, $R^{10}$, and $R^{11}$ represent, respectively and independently, a hydrogen atom or a lower alkyl group;
$R^{12}$, $R^{13}$, $R^{14}$, $R^{15}$, $R^{16}$, and $R^{17}$ represent, respectively and independently, a hydrogen atom, a halogen atom, a lower alkyl group, a lower alkoxy group, a lower alkenyl group, or a cycloalkyl group;
$R^{18}$ and $R^{19}$ represent, respectively and independently, a hydrogen atom, a halogen atom, or a lower alkyl group;
x, y, and z denote, respectively and independently, an integer ranging from 1 to 3; and
k denotes 0 or 1.

Examples of the hydroxyaryl compound represented by Formula (III) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenyl methane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxy phenyl)ethyl]benzene, 1-[1-(3-methyl-4-hydroxyphenyl)isopropyl]-4-[1,1-bis(3-methyl-4-hydroxyphenyl)ethyl]benzene, or the like.
(3) (hydroxyphenyl)hydrocarbon compounds, for example, but not limited to, a (hydroxyphenyl)hydrocarbon compound represented by Formula (IV):

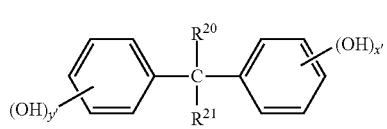

wherein
$R^{20}$ and $R^{21}$ represent, respectively and independently, a hydrogen atom or a lower alkyl group; and
x' and y' denote, respectively and independently, an integer ranging from 1 to 3.

Examples of the (hydroxyphenyl)hydrocarbon compound represented by Formula (IV) include, but are not limited to, 2-(2,3,4-trihydroxyphenyl)-2-(2',3',4'-trihydroxyphenyl) propane, 2-(2,4-dihydroxyphenyl)-2-(2',4'-dihydroxyphenyl)propane, 2-(4-hydroxyphenyl)-2-(4'-hydroxyphenyl) propane, bis(2,3,4-trihydroxyphenyl)methane, bis(2,4-dihydroxyphenyl)methane, or the like.
(4) other aromatic hydroxyl compounds, for example, but not limited to, phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified or partially etherified gallic acid, or the like.

The preferred examples of the hydroxyl compounds include 2,3,4-trihydroxybenzophenone and 2,3,4,4'-tetrahydroxybenzophenone. The aforesaid examples of the hydroxyl compounds can be used alone or as a mixture of two or more.

The reaction of o-naphthoquinonediazidesulfonic acid or salt thereof with the hydroxyl compound is often conducted in an organic solvent, such as dioxane, N-pyrrolidone, acetamide, or the like, in the presence of alkali, such as triethanolamine, carbonic acid alkali, hydrogen carbonate alkali, or the like.

Preferably, the esterification rate of the o-naphthoquinonediazidesulfonate compound is more than 50%. That is, more than 50% by mole of the hydroxyl group contained in the hydroxyl compound undergoes an esterification reaction with o-naphthoquinonediazidesulfonic acid or salt thereof, based on 100% by mole of the total hydroxyl group contained in the hydroxyl compound. More preferably, the esterification rate of the o-naphthoquinonediazidesulfonate compound is more than 60%.

The o-naphthoquinonediazidesulfonate compound is used in an amount ranging preferably from 0.5 to 80 parts by weight, more preferably from 1 to 50 parts by weight, and most preferably from 2 to 30 parts by weight, based on 100 parts by weight of polysiloxane.

Solvent:
There is no specific limitation to the solvent suitable in the photo-curing polysiloxane composition of the present invention. Examples of the solvent preferably include an alcoholic hydroxyl-containing compound, carbonyl-containing cyclic compound, or a combination thereof.

Examples of the alcoholic hydroxyl-containing compound include, but are not limited to, acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol, DAA), ethyl lactate, butyl lactate, propylene glycol monomethyl ether, propylene glycol monoethyl ether (PGEE), propylene glycol mono-n-propyl ether, propylene glycol mono-n-butyl ether, propylene glycol mono-t-butyl ether, 3-methoxy-1-butanol, 3-methyl-3-methoxy-1-butanol, or combinations thereof. Among them, diacetone alcohol, ethyl lactate, and propylene glycol monoethyl ether are preferable. The aforesaid alcoholic hydroxyl-containing compound can be used alone or as a mixture of two or more.

Examples of the carbonyl-containing cyclic compound include, but are not limited to, γ-butyrolactone, γ-valerolactone, δ-valerolactone, propylene carbonate, N-methylpyrrolidone, cyclohexanone, cycloheptanone, or combinations thereof. Among them, γ-butyrolactone, N-methylpyrrolidone, and cyclohexanone are preferable. The aforesaid carbonyl-containing cyclic compound can be used alone or as a mixture of two or more.

When the alcoholic hydroxyl-containing compound and the carbonyl-containing cyclic compound are used in combination, there is no specific limitation to the weight ratio thereof. Preferably, the weight ratio of the alcoholic hydroxyl-containing compound to the carbonyl-containing cyclic compound ranges from 99/1 to 50/50. More preferably, the weight ratio of the alcoholic hydroxyl-containing compound to the carbonyl-containing cyclic compound ranges from 95/5 to 60/40. It should be noted that, when the weight ratio of the alcoholic hydroxyl-containing compound to the carbonyl-containing cyclic compound ranges from 99/1 to 50/50, it is less likely for the unreactive silanol group in polysiloxane to undergo condensation reaction that may reduce the storage stability, Moreover, the miscibility of the o-naphthoquinonediazidesulfonate with the solvent is good, so that it is less likely to opaque the protective film, thereby maintaining the transparency of the protective film.

Further solvents other than the aforesaid solvent can be included in the photo-curing polysiloxane composition of the present invention as long as the desirable effects obtainable by the photo-curing polysiloxane composition are not impaired. Examples of the further solvents include, but are not limited to: (1) esters, for example, ethyl acetate, n-propyl acetate, isopropyl acetate, n-butyl acetate, isobutyl acetate, propylene glycol monomethyl ether acetate (PGMEA), 3-methoxy-1-butyl acetate, 3-methyl-3-methoxy-1-butyl acetate, or the like; (2) ketones, for example, methyl idobutyl ketone, diisopropyl ketone, diisobutyl ketone, or the like; (3) ethers, for example, diethyl ether, diisopropyl ether, di-n-butyl ether, diphenyl ether, or the like.

There is no specific limitation to the amount of the solvent used in the photo-curing polysiloxane composition. The solvent is used in an amount ranging generally from 50 to 1,200 parts by weight, preferably from 80 to 1,000 parts by weight, and more preferably from 100 to 800 parts by weight, based on 100 parts by weight of polysiloxane.

Additives:

Additives commonly used in the art can be optionally added to the photo-curing polysiloxane composition of the present invention, and include, but not limited to, a sensitizer, a thermal acid generator, an adhesion auxiliary agent, a surfactant, a solubility promoter, a defoamer, or combinations thereof.

There is no specific limitation to the sensitizer. Preferably, the sensitizer is a phenolic hydroxyl-containing compound, for example, but not limited to: (1) trisphenol type compounds, for example, tri(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-methylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3,4-dihydroxyphenylmethane, or the like; (2) bisphenol type compounds, for example, bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, or the like; (3) polynuclear branched compounds, for example, 1-[1-(4-hydroxyphenyl)isopropyl]-4-[1,1-bis(4-hydroxy phenyl)ethyl]benzene, 1-[1-(3-methyl-4-hydroxyphenyl]isopropyl]-4-[1,1-bis(3-methyl-4-hydroxyphenyl)ethyl]benzene, or the like; (4) condensation type phenol compounds, for example, 1,1-bis(4-hydroxyphenyl)cyclohexane, or the like; (5) polyhydroxy benzophenones, for example, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, or the like; or combinations thereof.

The sensitizer is used in an amount ranging preferably from 5 to 50 parts by weight, more preferably from 8 to 40 parts by weight, and most preferably from 10 to 35 parts by weight, based on 100 parts by weight of polysiloxane.

Examples of the thermal acid generator include, but are not limited to, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, and their methanesulfonate, trifluoromethanesulflate, camphorsulfonate, p-toluenesulfonates, or the likes thereof, commercially available products manufactured by Sanshin Chemical Industry Co. Ltd. (for example, SI-60, SI-80, SI-100, SI-110, SI-145, SI-150, SI-60L, SI-80L, SI-100L, SI-110L, SI-145L, SI-150L, SI-160L, SI-180L), or combinations thereof. Among them, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, 2-methylbenzyl-4-benzoyloxyphenylmethylsulfonium, and their methanesulfonate, trifluoromethanesulflate, camphorsulfonate, and p-toluenesulfonate are preferred. The aforesaid thermal acid generator can be used alone or as a mixture of two or more.

The thermal acid generator is used in an amount ranging preferably from 0.01 to 10 parts by weight, more preferably from 0.03 to 8 parts by weight, and most preferably from 0.05 to 5 parts by weight, based on 100 parts by weight of polysiloxane.

The adhesion auxiliary agent is used to enhance the adhesion of the photo-curing polysiloxane composition of the present invention to a substrate containing a semiconductor material. Examples of the adhesion auxiliary agent include, but are not limited to, melamine compounds and silane compounds. Examples of the commercially available products of the melamine compounds include, but are not limited to, Cymel-300, Cymel-303, or the like manufactured by Mitsui Chemicals; and MW-30 MH, MW-30, MS-11, MS-001, MX-750, MX-706, or the like manufactured by Sauwa Chemical. Examples of the silane compounds include, but are not limited to, vinyltrimethoxysilane, vinyltriethoxysilane, 3-(meth)acryloxypropyltrimethoxysilane, vinyltri(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxylsilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methylallyloxypropyltrimethoxysilane, 3-mercaptopropyltrimethoxysilane, commercially available products manufactured by Shin-Etsu Chemical Co., Ltd. (for example, KBM403), or the like.

The melamine compounds used as the adhesion auxiliary agent are in an amount ranging preferably from 0 to 20 parts by weight, more preferably from 0.5 to 18 parts by weight, and most preferably from 1.0 to 15 parts by weight, based on 100 parts by weight of polysiloxane.

The silane compounds used as the adhesion aid are in an amount ranging preferably from 0 to 2 parts by weight, more preferably from 0.05 to 1 part by weight, and most preferably from 0.1 to 0.8 part by weight, based on 100 parts by weight of polysiloxane.

Examples of the surfactant include, but are not limited to, anionic surfactant, cationic surfactant, nonionic surfactant, amphoteric surfactant, polysiloxane surfactant, fluorinated surfactant, or combinations thereof. Preferably, examples of the surfactant include, but are not limited to: (1) polyoxyethylene alkyl ethers, for example, polyoxyethylene lauryl ether, or the like; (2) polyoxyethylene alkyl phenyl ethers, for example, polyoxyethylene octyl phenyl ether, polyoxyethylene nonyl phenyl ether, or the like; (3) polyethylene glycol diesters, for example, polyethylene glycol dilaurate, polyethylene glycol distearate, or the like; (4) sorbitan fatty acid esters; (5) fatty acid modified polyesters; and (6) tertiary amine modified polyurethanes. Examples of commercially available products of the surfactant include KP (manufactured by Shin-Etsu Chemical Co., Ltd.), SF-8427 (manufactured by Toray Dow Corning Silicon), Polyflow (manufactured by Kyoeisha Chemical Co., Ltd.), F-Top (manufactured by Tochem Product Co., Ltd.), Megaface (manufactured by DIC), Fluorade (manufactured by Sumitomo 3M), Surflon (manufactured by Asahi Glass), SINOPOL E8008 (manufactured by Sino-Japan Chemical Co., Ltd.), F-475 (manufactured by DIC), or combinations thereof.

The surfactant is used in an amount ranging preferably from 0.5 to 50 parts by weight, more preferably from 1 to 40 parts by weight, and most preferably from 3 to 30 parts by weight, based on 100 parts by weight of polysiloxane.

Examples of the defoamer include Surfynol MD-20, Surfynol MD-30, EnviroGemAD01, EnviroGem AE01, EnviroGem AE02, Surfynol DF 110D, Surfynol 104E, Surfynol 420, Surfynol DF 37, Surfynol DF 58, Surfynol DF 66, Surfynol DF 70, and Surfynol DF 210 (manufactured by Air products), or the like.

The defoamer is used in an amount ranging preferably from 1 to 10 parts by weight, more preferably from 2 to 9 parts by weight, and most preferably from 3 to 8 parts by weight, based on 100 parts by weight of polysiloxane.

Examples of the solubility promoter include, but are not limited to, N-hydroxydicarboxylic imide, or phenolic hydroxyl compounds, for example, the hydroxyl compounds used for manufacturing the o-naphthoquinonediazidesulfonate compound.

The solubility promoter is used in an amount ranging preferably from 1 to 20 parts by weight, more preferably from 2 to 15 parts by weight, and most preferably from 3 to 10 parts by weight, based on 100 parts by weight of polysiloxane.

The photo-curing polysiloxane composition of the present invention is manufactured by stirring the polysiloxane, the o-naphthoquinonediazidesulfonate compound, and the solvent optionally together with the additives, such as the sensitizer, the thermal acid generator, the adhesion auxiliary agent, the surfactant, the defoamer, and the solubility promoter in a stirrer.

The photo-curing polysiloxane composition is applied on a substrate by spin coating, slit coating, or roll coating, and is then prebaked to remove the solvent and to form a prebaked coating film. The conditions for the prebaking depend on the types and the formulating ratio of the components for the photo-curing polysiloxane composition. However, the prebaking is usually conducted at a temperature ranging from 70 to 110° C. for a period ranging from 1 to 15 minutes. The prebaked coating film is exposed via a photomask using ultraviolet light, such as g-line, h-line, i-line, or the like. The device for providing the ultraviolet light includes a (ultra-) high pressure mercury lamp, or a metal halide lamp. The prebaked coating film after exposing is immersed in a developer solution at a temperature of 23±2° C. for a period ranging from 15 seconds to 5 minutes so as to form a desired pattern. Examples of the developer include alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethyl ammonium hydroxide, tetraethyl ammonium hydroxide, choline, pyrrole, piperidine, and 1,8-diazadicyclo-[5,4,0]-7-undecane, or the like.

The developer solution is used for developing the defined pattern formed after exposing the prebaked film of the photo-curing polysiloxane composition. When the concentration of the developer solution is too high, the defined pattern may be damaged or the resolution of the pattern may be reduced. On the other hand, when the concentration of the developer solution is too low, the development effect may be unsatisfactory, which may result in that the pattern cannot be formed or that residue remains at the exposed portion of the prebaked film. Therefore, the formability of the pattern is generally affected by the concentration of the developer solution. The present invention provides a photo-curing polysiloxane composition which can be used with a developer solution of a relatively broad concentration range. That is to say, the pattern formed after exposing the prebaked film of the photo-curing polysiloxane composition is not easily affected by the concentration of the developer solution.

The concentration of the developer solution ranges preferably from 0.001 to 10 wt %, more preferably from 0.005 to 5 wt %, and most preferably, from 0.01 to 1 wt %.

2.38% tetramethylammonium hydroxide solution and 0.4% tetramethylammonium hydroxide solution are used as the developer solution in the following examples, in which 2.38% tetramethylammonium hydroxide solution is a developer solution commonly used in the art. It will be found in the examples that a fine pattern can be formed in a protective film made from a photo-curing polysiloxane composition of the present invention using a developer solution of commonly used concentration (for example, 2.38% tetramethylammonium hydroxide solution) and even using a developer solution of a relatively dilute concentration (for example, 0.4% tetramethylammonium hydroxide solution).

The developer is removed by washing with water after the development. The coating film formed on the substrate is dried with compressed air or nitrogen, and is then post-baked using a heating device, such as a hot plate or an oven. The post-baking is conducted at a temperature ranging from 100 to 250° C. for a period ranging from 1 to 60 minutes if the hot plate is used or for a period ranging from 5 to 90 minutes if the oven is used. A protective film is formed on the substrate after the process aforementioned.

Examples of the substrate suitable for the present invention include alkali-free glass, soda-lime glass, Pyrex glass, quartz glass, a glass coated with a transparent conductive film thereon, and the like commonly used in a liquid crystal display; or a photoelectric conversion substrate (for example, a silicon substrate) used in a solid-state image sensor.

An element including the substrate and the protective film formed from the photo-curing polysiloxane composition of the present invention applied on the substrate can be used in a display device, a semiconductor device, an optical waveguide device, or the like.

The following examples are provided to illustrate the preferred embodiments of the invention, and should not be construed as limiting the scope of the invention.

EXAMPLES

Preparation of Polysiloxane

Preparation Example 1

A 500 ml three-necked flask was added with dimethyl dimethoxysilane (referred to as DMDMS, 78.0 g, 0.65 mole), phenyl trimethoxy silane (referred to as PTMS, 63.4 g, 0.32 mole), 3-triethoxysilylpropyl succinic anhydride (referred to as GF-20 (a trade name), 9.1 g, 0.03 mole), and propylene glycol monoethyl ether (referred to as PGEE, 200 g). Stirring was conducted at room temperature while an oxalic acid aqueous solution (0.25 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 100° C. The mixture in the flask was stirred for a further 5 hours to undergo polycondensation. After the solution in the flask was cooled to room temperature, acetone (2,000 g) was added and stirring was continued for a further 30 minutes. Precipitate was separated from the solution by filtration, followed by devolatilizing the solvent, thereby obtaining a polysiloxane (A-1).

Preparation Example 2

A 500 ml three-necked flask was added with DMDMS (78 g, 0.65 mole), phenyl triethoxy silane (referred to as PTES, 50.4 g, 0.21 mole), 2-oxetanylbutoxypropyltrimethoxysilance (referred to as TMSOX (a trade name), 38.9 g, 0.14 mole), and PGEE (200 g). Stirring was conducted at room temperature while an oxalic acid aqueous solution (0.30 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 6 hours to undergo polycondensation. After the solution in the flask was cooled to room temperature, ethylbenzene (1,800 g) was added and stirring was continued for a further 30 minutes. Precipitate was separated from the solution by filtration, followed by devolatilizing the solvent, thereby obtaining a polysiloxane (A-2).

Preparation Example 3

A 500 ml three-necked flask was added with DMDMS (84.0 g, 0.70 mole), PTMS (45.5 g, 0.23 mole), 3-trimethoxysilylpropyl glutaric anhydride (referred to as TMSG, 19.3 g, 0.07 mole), and PGEE (200 g). Stirring was conducted at room temperature while an oxalic acid aqueous solution (0.35 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 6 hours to undergo polycondensation. After the solution in the flask was cooled to room temperature, acetone (1,500 g) was added and stirring was continued for a further 30 minutes. Precipitate was separated from the solution by filtration, followed by devolatilizing the solvent, thereby obtaining a purified polysiloxane. The purified polysiloxane was dissolved in PGEE (200 g) by stirring at room temperature to obtain a homogeneous solution. After the solution was added with isopropylbenzene (1500 g), the solution was stirred for a further 30 minutes. Precipitate was separated from the solution by filtration, followed by devolatilizing the solvent, thereby obtaining a polysiloxane (A-3).

Preparation Example 4

A 500 ml three-necked flask was added with DMDMS (84.0 g, 0.70 mole), PTMS (29.7 g, 0.15 mole), PTES (28.8 g, 0.12 mole), GF-20 (9.2 g, 0.03 mole), PGEE (100 g), and diacetone alcohol (referred to as DAA, 100 g). Stirring was conducted at room temperature while an oxalic acid aqueous solution (0.40 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 110° C. The mixture in the flask was stirred for a further 5 hours to undergo polycondensation. After the solution in the flask was cooled to room temperature, acetone (1,500 g) was added and stirring was continued for a further 30 minutes. Precipitate was separated from the solution by filtration, followed by devolatilizing the solvent, thereby obtaining a purified polysiloxane. The purified polysiloxane was dissolved in PGEE (200 g) by stirring at room temperature to obtain a homogeneous solution. After the solution was added with acetone (1500 g), the solution was stirred for a further 30 minutes. Precipitate was separated from the solution by filtration, followed by devolatilizing the solvent, thereby obtaining a polysiloxane (A-4).

Preparation Example 5

A 500 ml three-necked flask was added with methyltrimethoxysilane (referred to as MTMS, 102.0 g, 0.75 mole), PTMS (19.8 g, 0.10 mole), diisopropoxy-di(2-oxetanylbutoxypropyl)silane (referred to as DIDOS, 69.0 g, 0.15 mole), and PGEE (200 g). Stirring was conducted at room temperature while an oxalic acid aqueous solution (0.40 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 6 hours to undergo polycondensation. After the solution in the flask was cooled to room temperature, isopropylbenzene (1,500 g) was added and stirring was continued for a further 30 minutes. Precipitate was separated from the solution by filtration, followed by devolatilizing the solvent, thereby obtaining a purified polysiloxane. The purified polysiloxane was dissolved in PGEE (200 g) by stirring at room temperature to obtain a homogeneous solution. After the solution was added with acetone (2,000 g), the solution was stirred for a further 30 minutes. Precipitate was separated from the solution by filtration, followed by devolatilizing the solvent, thereby obtaining a polysiloxane (A-5).

Preparation Example 6

A 500 ml three-necked flask was added with MTMS (97.9 g, 0.72 mole), PTMS (31.7 g, 0.16 mole), GF-20 (27.4 g, 0.09 mole), DMS-S27 (540 g, 0.03 mole), and PGEE (200 g). Stirring was conducted at room temperature while an oxalic acid aqueous solution (0.35 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 110° C. The mixture in the flask was stirred for a further 6 hours to undergo polycondensation. After the solution in the flask was cooled to room temperature, ethylbenzene (2,000 g) was added and stirring was continued for a further 30 minutes. Precipitate was separated from the solution by filtration, followed by devolatilizing the solvent, thereby obtaining a purified polysiloxane. The purified polysiloxane was dissolved in PGEE (200 g) by stirring at room temperature to obtain a homogeneous solution. After the solution was added with ethylbenzene (1,800 g), the solution was stirred for a further 30 minutes. Precipitate was separated from the solution by filtration, followed devolatilizing the solvent, thereby obtaining a polysiloxane (A-6).

Preparation Example 7

A 500 ml three-necked flask was added with MTMS (102.0 g, 0.75 mole), PTES (36.0 g, 0.15 mole), TMSOX (25.1 g, 0.09 mole), DMS-S27 (180 g, 0.01 mole), and PGEE (200 g). Stirring was conducted at room temperature while an oxalic acid aqueous solution (0.45 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 110° C. The mixture in the flask was stirred for a further 6 hours to undergo polycondensation. After the solution in the flask was cooled to room temperature, acetone (1,500 g) was added and stirring was continued for a further 30 minutes. Precipitate was separated from the solution by filtration, followed by devolatilizing the solvent, thereby obtaining a polysiloxane (A-7).

Preparation Example 8

A 500 ml three-necked flask was added with DMDMS (84.0 g, 0.70 mole), PTMS (47.5 g, 0.24 mole), GF-20 (18.3 g, 0.06 mole), and PGEE (200 g). Stirring was conducted at room temperature while an oxalic acid aqueous solution (0.35 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 6 hours to undergo polycondensation, followed by devolatilizing the solvent, thereby obtaining a polysiloxane (A-8).

The amounts of the silane monomers, the siloxane prepolymers, the solvents, and the catalysts, and the reaction conditions used in the preparation examples are summarized in Table 1.

TABLE 1

| | Composition | | | | | | | | | | | | Reaction | |
|---|---|---|---|---|---|---|---|---|---|---|---|---|---|---|
| | Silane monomers/ Siloxane prepolymers (moles) | | | | | | | | | Solvents (g) | | Catalysts (g) | | |
| Prep. Ex. | MTMS | DMDMS | PTMS | PTES | GF-20 | TMSG | TMSOX | DIDOS | DMS-S27 | PGEE | DAA | water | Oxalic acid | Temp. (° C.) | Polycond. Time (hrs) |
| A-1 | — | 0.65 | 0.32 | — | 0.03 | — | — | — | — | 200 | — | 75 | 0.25 | 100 | 5 |
| A-2 | — | 0.65 | — | 0.21 | — | — | 0.14 | — | — | 200 | — | 75 | 0.30 | 105 | 6 |
| A-3 | — | 0.70 | 0.23 | — | — | 0.07 | — | — | — | 200 | — | 75 | 0.35 | 105 | 6 |
| A-4 | — | 0.70 | 0.15 | 0.12 | 0.03 | — | — | — | — | 100 | 100 | 75 | 0.40 | 110 | 5 |
| A-5 | 0.75 | — | 0.10 | — | — | — | — | 0.15 | — | 200 | — | 75 | 0.40 | 105 | 6 |
| A-6 | 0.72 | — | 0.16 | — | 0.09 | — | — | — | 0.03 | 200 | — | 75 | 0.35 | 110 | 6 |
| A-7 | 0.75 | — | — | 0.15 | — | — | 0.09 | — | 0.01 | 200 | — | 75 | 0.45 | 110 | 6 |
| A-8 | — | 0.70 | 0.24 | — | 0.06 | — | — | — | — | 200 | — | 75 | 0.35 | 105 | 6 |

Preparation of Photo-curing Polysiloxane Composition

Example 1

100 parts by weight of the polysiloxane (A-3) obtained in Preparation Example 3, 15 parts by weight of an o-naphthoquinonediazidesulfonate compound (DPAP200 manufactured by DKC, average esterification rate: 67%) obtained by reacting 1-[1-(4-hydroxyphenyl)isopropyl]-4-[1,1-bis(4-hydroxy phenyl)ethyl]benzene (referred to as TPPA) with o-naphthoquinonediazide-5-sulfonic acid were added into a solvent mixture consisting of 400 parts by weight of diacetone alcohol and 100 parts by weight of N-methylpyrrolidone. Stirring was conducted using a shaking type stirrer until a homogenous photo-curing polysiloxane composition was obtained. The obtained photo-curing polysiloxane composition was evaluated according to the following evaluation methods to be described hereinafter. The evaluation results are shown in Table 2.

Examples 2 to 8 and Comparative Examples 1 to 4

Examples 2 to 8 and Comparative Examples 1 to 4 were conducted in a manner identical to that of Example 1 using the components and the amounts thereof shown in Table 2. The obtained photo-curing polysiloxane compositions of Examples 2 to 8 and Comparative Examples 1 to 4 were evaluated according to the following evaluation methods. The evaluation results are shown in Table 2.

Evaluation Methods:

1. Molecular Weight Distribution of Polysiloxane:

The molecular weight distribution of polysiloxane was determined by gel permeation chromatography (referred to as GPC) under the following conditions. As exemplified in FIG. 1, an integral molecular weight distribution curve was obtained by plotting cumulative weight percentage versus molecular weight falling within a range between 400 and 100,000. The weight percentage of a polysiloxane fraction having a molecular weight ranging from 10,000 to 80,000 was calculated from the integral molecular weight distribution curve.

Measurement Conditions for the GPC:
  Apparatus: 717 plus (manufactured by Waters)
  Columns: 79911GP-501, 79911GP-502, 79911GP-503, and 79911GP-504 (manufactured by Agilent Technologies)
  Detector: 2414 RI Detector (manufactured by Waters)
  Mobile Phase: tetrahydrofuran
  Flow rate: 1.0 ml/min
  Injection Volume: 100 μl
  Measurement Temperature: 40° C.
  Measurement Period: 60 minutes
  Molecular Weight Standard: polystyrene 2. Amount Analysis of Oligomers in a Polysiloxane:

The photo-curing polysiloxane compositions obtained in Examples 1 to 8 and Comparative Examples 1 to 4 were respectively dissolved in acetone, and were analyzed by a gas chromatograph (manufactured by Hewlett Packard; Model No. 5890A) equipped with a flame ionization detector (FID). The results were recorded in wt %.

3. Alkali Dissolution Rate:

Polysiloxane was spin-coated onto a glass substrate of 100 mm×100 mm, and was then pre-baked at a temperature of 110° C. for 2 minutes to form a pre-baked coating film having a thickness of 8 μm. Two specimens of the pre-baked coating film were respectively immersed in 2.38% tetramethylammonium hydroxide solution and 0.4% tetramethylammonium hydroxide solution at 23° C. for 30 seconds. The thickness ($\delta_d$) of the pre-baked coating film after the development was measured using an optical thickness measurement system. The alkali dissolution rate was calculated using the following formula:

Alkali dissolution rate (Å/sec)=[(80000)−($\delta_d$)]/30

4. Observation of a Pattern Formed after Post-baking:

The photo-curing polysiloxane composition was spin-coated onto a glass substrate of 100 mm×100 mm, and was then pre-baked at a temperature of 110° C. for 2 minutes to form a pre-baked coating film. The pre-baked coating film was treated with ultra-violet irradiation (90 mJ/cm$^2$) using an exposure machine (Model No. AG500-4N, manufactured by M & R Nano Technology) through a photo-mask. Two specimens of the pre-baked coating film after the ultra-violet irradiation were respectively immersed in 2.38% tetramethylammonium hydroxide solution and 0.4% tetramethylammonium hydroxide solution at 23° C. for 1 minute. The specimens were then washed with water and were post-baked in an oven at 230° C. for 60 minutes. The developed pattern on each of the specimens was observed using a scanning electron microscope to determine whether or not reflow is present in the developed pattern.

○: Reflow was not present.
Δ: Mild reflow was present.
X: Serious reflow was present.

TABLE 2

| Components | | Examples | | | | | | | | Comparative Examples | | | |
|---|---|---|---|---|---|---|---|---|---|---|---|---|---|
| | | 1 | 2 | 3 | 4 | 5 | 6 | 7 | 8 | 1 | 2 | 3 | 4 |
| Polysiloxanes (pbw) | A-1 | — | — | — | — | — | — | — | — | 100 | — | — | — |
| | A-2 | — | — | — | — | 90 | — | — | — | — | 100 | — | — |
| | A-3 | 100 | — | — | — | — | 70 | — | — | — | — | — | — |
| | A-4 | — | 100 | — | — | — | 30 | — | 50 | — | — | — | — |
| | A-5 | — | — | 100 | — | 10 | — | 20 | — | — | — | — | — |
| | A-6 | — | — | — | 100 | — | — | — | — | — | — | — | — |
| | A-7 | — | — | — | — | — | — | 80 | — | — | — | 100 | — |
| | A-8 | — | — | — | — | — | — | — | 50 | — | — | — | 100 |
| o-naphthoquinone diazidesulfonate compounds (pbw) | B-1 | 15 | 10 | 30 | 5 | 10 | 25 | 15 | 10 | 15 | 15 | 15 | 15 |
| | B-2 | — | — | — | — | 5 | — | — | — | — | — | — | — |
| Solvents (pbw) | C-1 | 400 | 450 | 350 | 300 | 600 | — | 200 | 300 | 400 | 400 | 400 | 400 |
| | C-2 | 100 | 50 | 150 | 200 | — | 800 | — | — | 100 | 100 | 100 | 100 |
| | C-3 | — | — | — | 50 | — | — | — | 200 | — | — | — | — |
| Additives | D-1 | — | — | 3 | — | — | — | 1 | — | — | — | — | — |

TABLE 2-continued

| Components | | Examples 1 | 2 | 3 | 4 | 5 | 6 | 7 | 8 | Comparative Examples 1 | 2 | 3 | 4 |
|---|---|---|---|---|---|---|---|---|---|---|---|---|---|
| (pbw) | D-2 | — | — | — | — | 0.3 | — | 0.2 | — | — | — | — | — |
| Evaluation Items | A polysiloxane fraction having a molecular weight ranging from 10,000 to 80,000 (Wt %) | 29 | 37 | 45 | 54 | 25 | 31 | 59 | 33 | 18 | 23 | 62 | 29 |
| | Oligomers in a polysiloxane having a molecular weight less than 800 (wt %) | 4 | 5 | 2 | 3 | 5 | 4 | 6 | 9 | 12 | 6 | 7 | 14 |
| | Alkali dissolution rate (Å/sec) | 1423 | 904 | 1467 | 225 | 1302 | 1267 | 360 | 1158 | 1131 | 1284 | 86 | 1418 |
| | a pattern formed in a post-baked film (after development using 2.38% developer solution) | ○ | ○ | ○ | ○ | ○ | ○ | ○ | ○ | X | X | X | X |
| | a pattern formed in a post-baked film (after development using 0.4% developer solution) | ○ | ○ | ○ | ○ | ○ | ○ | ○ | ○ | X | X | — | X |

B-1: an o-naphthoquinonediazidesulfonate compound obtained by reacting 1-[1-(4-hydroxyphenyl)isopropyl]-4-[1,1-bis(4-hydroxyphenyl)ethyl]benzene with o-naphthoquinonediazide-5-sulfonic acid;
B-2: an o-naphthoquinonediazidesulfonate compound obtained by reacting 2,3,4,4'-tetrahydroxybenzophenone with o-naphtho-quinonediazide-5-sulfonic acid;
C-1: diacetone alcohol (DAA);
C-2: n-methyl pyrrolidone (NMP);
C-3: propylene glycol monomethyl ether acetate (PGMEA);
D-1: F-475 (a surfactant) manufactured by DIC;
D-2: KBM403 (an adhesion aid) manufactured by Shin-Etsu Chemical Co., Ltd.
—: a developed pattern can not be formed.

As shown in Table 2, all of the polysiloxane contained in the photo-curing polysiloxane compositions of Examples 1 to 8 contain 25 wt % to 60 wt % (i.e., 29, 37, 45, 54, 25, 31, 59, and 33 wt %, respectively) of a polysiloxane fraction having a molecular weight ranging from 10,000 to 80,000 based on a total weight of said polysiloxane, and not more than 10 wt % of oligomers in the polysiloxane having a molecular weight less than 800 based on a total weight of said photo-curing polysiloxane composition. The above-mentioned photo-curing polysiloxane compositions are adapted to 2.38%, even 0.4% developer solution, and the cured film formed after post-baking have good shape patterns with no reflow.

However, the polysiloxane contained in the photo-curing polysiloxane composition of Comparative Example 1 contains 18 wt % (i.e., less than the defined range of 25 wt % to 60 wt %) of a polysiloxane fraction having a molecular weight ranging from 10,000 to 80,000, and 12 wt % (i.e., greater than the defined range of 0 wt % to 10 wt %) of oligomers in the polysilxoane having a molecular weight less than 800. The polysiloxane contained in the photo-curing polysiloxane compositions of Comparative Examples 2 and 3 respectively contains 23 wt % and 62 wt % (i.e., out of the defined range of 25 wt % to 60 wt %) of a polysiloxane fraction having a molecular weight ranging from 10,000 to 80,000. The polysiloxane contained in the photo-curing polysiloxane composition of Comparative Example 4 contains 14 wt % (i.e., greater than the defined range of 0 wt % to 10 wt %) of oligomers in the polysiloxane having a molecular weight less than 800. In the Comparative Examples 1 to 4, all of the developed patterns formed after post-baking have a serious reflow problem.

In view of the aforesaid, the present invention provides a photo-curing polysiloxane composition having a proper softening point and good developing property, and a protective film made from the photo-curing polysiloxane composition via pre-baking, exposing, developing, and post-baking. The developed pattern in the protective film obtained from the composition of the present invention is not liable to reflow after post-baking.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photo-curing polysiloxane composition, comprising:
   a polysiloxane;
   an o-naphthoquinonediazidesulfonate compound; and a solvent;
   wherein said polysiloxane contains 25 wt % to 60 wt % of a polysiloxane fraction having a molecular weight ranging from 10,000 to 80,000 based on a total weight of said polysiloxane when calculated from an integral molecular weight distribution curve obtained by plotting cumulative weight percentage versus molecular weight falling within a range between 400 and 100,000 measured by gel permeation chromatography, and
   wherein the amount of oligomers in the polysiloxane having a molecular weight less than 800 is from 0 wt % to 10 wt % based on a total weight of said photo-curing polysiloxane composition.

2. The photo-curing polysiloxane composition as claimed in claim 1, wherein said polysiloxane has an alkali dissolution rate ranging from 100 to 1500 Å/sec.

3. The photo-curing polysiloxane composition as claimed in claim 1, wherein said o-naphthoquinonediazidesulfonate compound is in an amount ranging from 0.5 to 80 parts by weight and said solvent is in an amount ranging from 50 to 1200 parts by weight based on 100 parts by weight of said polysiloxane.

4. The photo-curing polysiloxane composition as claimed in claim 1, wherein the amount of said oligomers in the polysiloxane having a molecular weight less than 800 is from 0.001 to 9 wt % based on the total weight of said photo-curing polysiloxane composition.

5. The photo-curing polysiloxane composition as claimed in claim 1, wherein the amount of said oligomers in the polysiloxane having a molecular weight less than 800 is from 0.001 to 8 wt % based on the total weight of said photo-curing polysiloxane composition.

6. A protective film adapted to be formed on a substrate, said protective film being formed by applying the photo-curing polysiloxane composition as claimed in claim 1 on the substrate.

7. An element, comprising a substrate, and the protective film as claimed in claim 6 applied on said substrate.

* * * * *